United States Patent
Heck et al.

(10) Patent No.: US 10,386,823 B2
(45) Date of Patent: Aug. 20, 2019

(54) METHOD AND APPARATUS FOR DISTRIBUTED PROCESS CONTROL

(71) Applicant: SIEMENS AKTIENGESELLSCHAFT, München (DE)

(72) Inventors: Christian Heck, Remchingen (DE); Gerrit Wolf, Karlsruhe (DE)

(73) Assignee: Siemens Aktiengesellschaft, München (DE)

( * ) Notice: Subject to any disclaimer, the term of this patent is extended or adjusted under 35 U.S.C. 154(b) by 339 days.

(21) Appl. No.: 15/170,551

(22) Filed: Jun. 1, 2016

(65) Prior Publication Data

US 2016/0357179 A1 Dec. 8, 2016

(30) Foreign Application Priority Data

Jun. 2, 2015 (EP) .................................... 15170297

(51) Int. Cl.
*G05B 11/01* (2006.01)
*G06F 17/50* (2006.01)
*G05B 19/418* (2006.01)

(52) U.S. Cl.
CPC ...... *G05B 19/41835* (2013.01); *G05B 11/011* (2013.01); *G05B 19/4185* (2013.01);
(Continued)

(58) Field of Classification Search
CPC ........ B63B 2035/4453; F24J 2002/4667; F24J 2/526; F24J 2/5267; G05B 11/011;
(Continued)

(56) References Cited

U.S. PATENT DOCUMENTS 6,298,454 B1    10/2001   Schleiss et al.
7,496,911 B2 *   2/2009   Rowley ..................... G06F 8/61
                                                              717/174
(Continued)

FOREIGN PATENT DOCUMENTS

CN       1494670 A       5/2004
CN     102013045 A       4/2011
(Continued)

OTHER PUBLICATIONS

Cayicirci Erdal: "Modeling and simulation as a cloud service: A survey"; 2013 Winter Simulations Conference (WSC); IEEE; pp. 389-400; XP032559276; DOI: 10.1109/WSC.2013.6721436.
(Continued)

*Primary Examiner* — Kenneth M Lo
*Assistant Examiner* — Chad G Erdman
(74) *Attorney, Agent, or Firm* — Henry M. Feiereisen LLC

(57) ABSTRACT

A distributed process control system having at least one automation unit on the plant side that calculates a plurality of first process variables and influences the process that is connected by first data link to a monitoring system that controls and/or monitors the process. The system has an external computing unit that is connected by a distributed communication mechanism to the automation unit and exchanges data with it using a second data link. The external computing unit calculates a plurality of second process variables that the of the automation unit uses to influence the process. A method for extending the function of at least one plant-side automation unit is also disclosed.

12 Claims, 1 Drawing Sheet

(52) U.S. Cl.
CPC ... *G05B 19/41885* (2013.01); *G06F 17/5009* (2013.01); *G05B 2219/13179* (2013.01); *G05B 2219/13186* (2013.01); *G05B 2219/32136* (2013.01); *G05B 2219/33317* (2013.01); *Y02P 90/18* (2015.11)

(58) Field of Classification Search
CPC .......... G05B 19/41835; G05B 19/4185; G05B 19/41885; G05B 2219/13179; G05B 2219/13186; G05B 2219/32136; G05B 2219/33317; G06F 17/5009; H02S 20/30; H02S 30/10; Y02E 10/47; Y02P 90/18
See application file for complete search history.

(56) References Cited

U.S. PATENT DOCUMENTS

| | | | | |
|---|---|---|---|---|
| 7,738,975 | B2* | 6/2010 | Denison | G05B 13/0275 700/29 |
| 9,529,348 | B2* | 12/2016 | Kephart | G05B 17/02 |
| 9,541,918 | B2* | 1/2017 | Shi | G05B 19/418 |
| 9,606,531 | B2* | 3/2017 | Cheng | G05B 19/41885 |
| 2008/0273547 | A1* | 11/2008 | Phinney | H04L 1/1607 370/437 |
| 2009/0319058 | A1 | 12/2009 | Rovaglio et al. | |
| 2010/0076604 | A1* | 3/2010 | Johnson | G05B 19/042 700/275 |
| 2010/0204924 | A1* | 8/2010 | Wolfe | C02F 1/008 702/25 |
| 2010/0222899 | A1* | 9/2010 | Blevins | G05B 17/02 700/80 |
| 2011/0029102 | A1 | 2/2011 | Campney et al. | |
| 2012/0150507 | A1 | 6/2012 | Gallestey et al. | |
| 2013/0191106 | A1 | 7/2013 | Kephart et al. | |
| 2013/0253684 | A1 | 9/2013 | Rudnick et al. | |
| 2014/0379134 | A1* | 12/2014 | Tsuchiya | G05B 19/0426 700/275 |
| 2015/0277429 | A1* | 10/2015 | Drath | G05B 17/02 700/108 |
| 2015/0378328 | A1* | 12/2015 | Gustin | H04L 67/12 700/9 |
| 2016/0261115 | A1* | 9/2016 | Asati | H02J 3/14 |

FOREIGN PATENT DOCUMENTS

| | | | |
|---|---|---|---|
| CN | 102124432 A | 7/2011 | |
| CN | 102483613 A | 5/2012 | |
| CN | 103217907 A | 7/2013 | |
| CN | 104303117 A | 1/2015 | |
| EP | 2293164 A1 | 3/2011 | |
| JP | 2015056766 A * | 3/2015 | ............ H04M 11/00 |

OTHER PUBLICATIONS

Wilhoit Kyle: "SCADA in the Cloud a Security Conundrum?"; pp. 1-11; XP055223954; URL:http://www.trendmicro.com/cloud-content-us-pdfs/security-intelligence/white-paper/wp-scada-in-the-cloud.pdf.

Muntean Ionut et al: "Remote Management: An Architecture for Mechatronic Systems"; 2013 IEEE 10th International Conference on E-Business Engineering; pp. 498-593; XP032534345; DOI: 10.1109/ICEBE.2013.78.

Zhang, Yanbing, et al., "distributed computer control technology", pp. 240 and 241, National Defence Industry Press, publ. Aug. 2006, 1st edition; 2006.

* cited by examiner

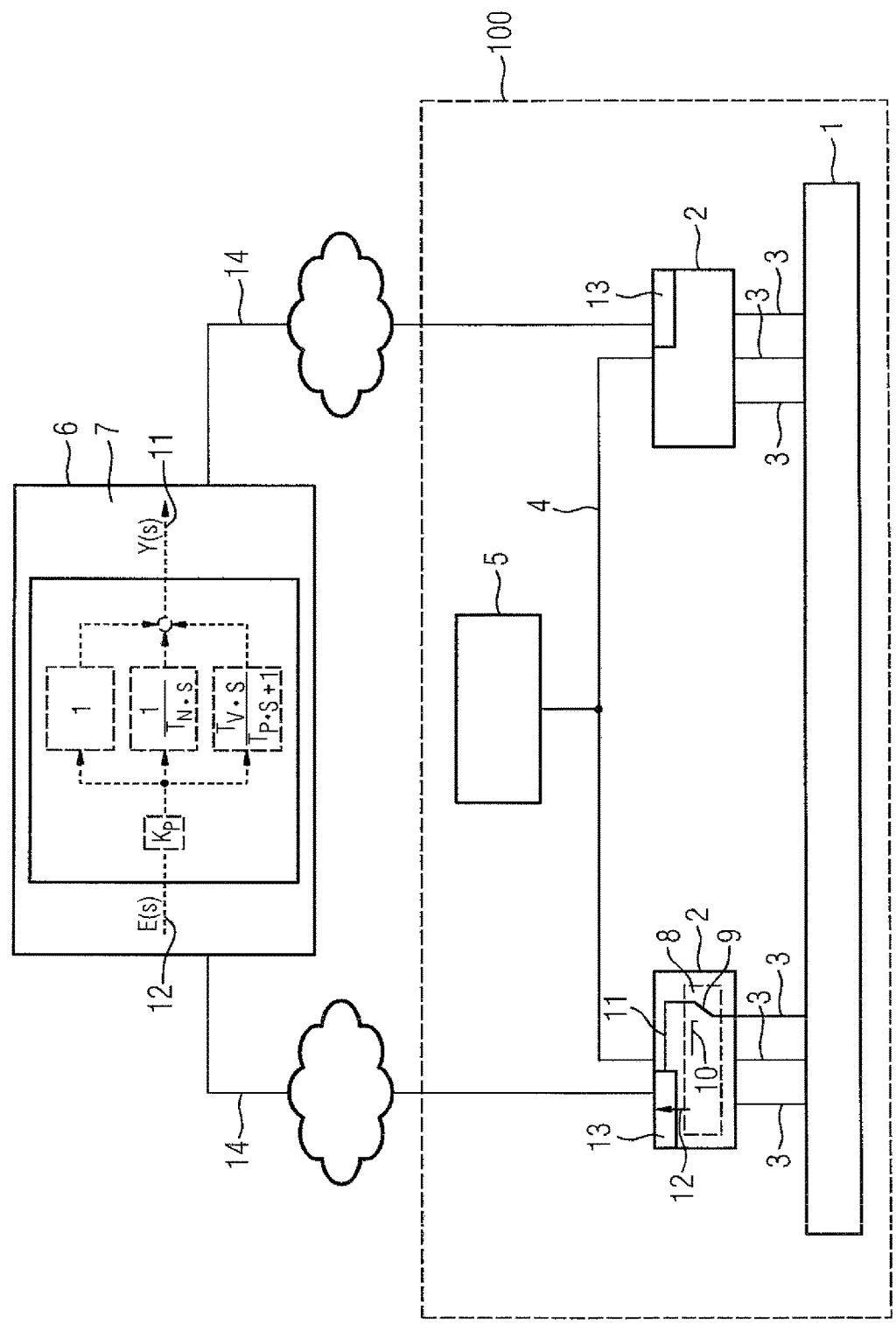

ions to be provided in automated processing plants in a cost-effective and largely non-intrusive manner.

METHOD AND APPARATUS FOR DISTRIBUTED PROCESS CONTROL

CROSS-REFERENCES TO RELATED APPLICATIONS

This application claims the priority of European Patent Application, Serial No. EP 15 17 0297.4, filed Jun. 2, 2015, pursuant to 35 U.S.C. 119(a)-(d), the disclosure of which is incorporated herein by reference in its entirety as if fully set forth herein.

BACKGROUND OF THE INVENTION

The invention relates to a distributed process control system for an automated plant and to a method for controlling the automated plant.

Simple automation and control engineering tasks are generally sufficient for performing process control for a plurality of plants. These tasks very often are not time-critical, having control time variables that are measured in seconds, for example water treatment in sewage treatment plants. Further general examples include pipeline management for gas, oil, and water pipeline systems, drying intermediate products in the food industry such as cooking oil drying and grain drying, and the manufacture of glass products or of flotation glass. Such plants most often have multiple physically separate, smaller automation units, so that individual tasks in the process are run in a distributed manner, and those smaller automation units may be unable to provide the kind of complex control structures and control and/or simulation strategies that can be provided by more advanced types of automation devices.

A more complex control strategy for process engineering is the model-predictive control (MPC) method, which may require significant computing capacity. It is also frequently desirable to set up simulation models, in order to be able to optimize the process using this control method. Thus computation-intensive process engineering methods or simulation models are frequently used by the more advanced control and monitoring systems of automated plants. However, to preserve the advantages of a decentralized plant concept, it is also desirable to implement such process engineering and/or simulation methods locally, close to the process itself, even if the restricted computing capacity of the automation units that are close to the process does not permit this.

The advantage of such localized process-oriented solutions is obvious, since they reduce the overall complexity and thereby make the system less prone to faults. Thus, local solutions that are connected in parallel are primarily used today to extend the automation functions of existing systems, but a significant disadvantage of these solutions is their price, the cost of the additional hardware and the service that it requires, because such solutions must be maintained locally. This maintenance of the hardware is often purely an adjustment of its parameters required by changes in the behavior of the process as the characteristic curves of the actuator hardware, such as the valves and slide switches or the pipework, change over the course of time, as deposits, wear, etc. cause general displacements in their dynamic behavior.

SUMMARY OF THE INVENTION

The invention provides a method and apparatus which advantageously enable functional extensions and improvements to be provided in automated processing plants in a cost-effective and largely non-intrusive manner.

Apparatus for controlling a process in accordance with the invention has at least one automation unit that performs a first process variable calculation. This automation unit is arranged close to the process, and is operatively connected to receive inputs from sensors and actuators that are used by the process, and to provide process variables to the process that are calculated using inputs from the sensors and actuators. A first data link operatively connects the automation unit to a higher-level monitoring system for controlling and/or monitoring the process. A second data link operatively connects at least one external computing unit to exchange messages with the automation unit using a distributed communication mechanism.

The external computing unit is physically and/or functionally outside the original automation system, in an external service provider for instance. Distributed communication mechanisms include the communication standards OPC (OPC DA, OPC UA) or TCP/IP (Profinet), for instance, which allow independent computing units to merge, forming a distributed system. The external computing unit performs a number of second process variable calculations. The second process variable calculations provided by the external computing unit are used by the automation unit to influence the control of the process by the automation unit. The second process calculations that are performed in the external computing unit are far more complex and computation-intensive than those that can be performed by the automation unit.

Thus, the external computing unit provides extended control engineering functions—such as those provided by known MPC controllers, for instance. Moreover, condition monitoring systems, simulation systems or history systems within the external computing unit can also access the signals processed by the control function of the automation unit. to perform additional evaluations. With such extended control engineering functions, if possible deviations from the intended behavior are projected based on historical data, the current control parameters calculated by automation unit can then be adjusted very advantageously. This remote adjustment of such parameters eliminates the need for local intervention by a service team at the plant.

The advantages of such a system are obvious. With the aid of the plant-specific condition monitoring, simulation and history provided by the external computing unit, models, strategies and/or optimizations of the plant's automation process can be evaluated by the by the external computing unit, and then put online by the automation unit, after successful testing in a simulation provided by the external computing unit. An extension of the useful life of existing plants with new automation algorithms and methods and, likewise, a cost-effective optimization of the plant's energy consumption, product quality, operating time, etc. is possible. No additional local hardware, and thus no complicated installation and servicing of the hardware, are required. Moreover, maintenance and servicing of distributed automation components from a single location is then possible. Externally implementing simulations in this way, ensures continuous operation and enables control functions to be the optimized over the service life of the plant.

It has also proven advantageous for simulation tasks mapped in simulation models to be run in a further external computing unit that is connected to the first external computing unit. The further external computing unit then uses data from a given plant or process to supply a simulation model of it throughout its operation that can be adjusted and optimized in a virtually self-learning manner, thus providing more precise knowledge of the process. A simulation model that is optimized in this way can improve the predictive quality of the control method and thus the quality of the control provided in the entire plant. Such a simulated "shadow" plant or process can in turn be used for migration of current control parameters when updating hardware or implementing other planned changes in a plant's processes. They could also provide the basis for virtual commissioning of new hardware or processes, for instance.

According to a further aspect of the invention, simulation models that provide different optimization priorities can be implemented by the external computing unit, and then throughput of a production function can be optimized using one optimization that provides the most economical use of energy or material resources, for instance. Others could be used that emphasize the quality rating of the product, such as the hexane content used to dry cooking oil, or the residual nitrate content of purified waste water.

According to a further aspect of the invention, dynamic optimization strategies are used with the simulation model, or simulation models, that react to external influences and integrating such factors as the daily prices for raw materials and energy, the availability and cost of personnel, and also online stock exchange or weather data, into the control of the automated process. The external computing unit may then include an interface to obtain such data from respective service providers or, alternatively, may call up such data directly from the plant operator's other systems—a procurement system, for instance. This very advantageously enables the user to adjust the control of the automated process to current conditions by selectively changing the optimization strategies being used. Such changes in the individual optimization strategies being used may advantageously be implemented centrally and automatically.

The effect of the second process variable calculations provided by the external computing unit to the plant-side automation unit is to enable the control and optimization of the process by the automation unit to provide greater value and responsiveness. Only if the second data link is faulty will the process variables calculated by the plant-side automation unit be executed, enabling the plant to be kept in operation in the event of a fault in the second data link or in the external computing unit, which delivers faulty data or no data at all to the automation unit.

Advantageously, if a service agent is assigned to a plant-side automation unit and supplies the external computing unit with process data from the plant-side automation unit, the service agent can then select which process data is sent to the external computing unit and in which time intervals. This service agent is a data collection subsystem that can be connected to a data source, such as a software function within the plant-side automation system. The plant-side service agent is able to collect or capture data by way of the most diverse range of real-time interfaces, for instance SIMATIC NET OPC, OPC DA, OPC UA, Modbus or SNMP, by accessing specific files in which data from the automation system is stored, for instance *.csv or *.xml files. An interface, usually with a separate tool, uses what are known as scripts to enable the user to define what data will be sent to the user at which times by the service agent, and what pre-treatment of the data should take place in the automation unit.

Preferably, each item of process data, such as a measurement point, also includes a time stamp and a quality code, in addition to the location of the analog or digital value measured. The scanning rate at a measurement point is also a variable that can be configured—for instance for values ranging from one second up to one day. Also, if the data quantities have to be limited, and/or if complex triggering conditions have to be evaluated, corresponding pre-treatment of this data is then provided by the agent before that data is sent to the external computing unit A method in accordance with the invention extends the functions provided by the first process variable calculations of the automation unit to provide further automation functions. In a first step an external computing unit calculates second process variables that implement further, more complex automation functions. For example, such more complex automation functions can program-based implementation of predictive-model control concepts, in particular, which can be paired with simulation systems. In a further step, the external computing unit exchanges process data with at least one plant-side automation unit using a second data link using a distributed communication mechanism. The process variable calculations performed by the external computing unit performed in parallel with process variable calculations performed by the plant-side automation unit. However, the process variable calculations of the plant-side automation unit are ineffective to the extent that the second process variable calculations implement control of the plant-side process, wherein the process is influenced by outputs of the plant-side automation unit that are controlled by the second process variables calculated by the external computing unit.

According to a further aspect of the aforesaid method, the process variables used by plant-side automation unit, i.e., the control of the process itself, is monitored using these two process variable calculations. The monitoring system, which is connected to the plant-side automation unit by the first data link, compares results of second process variable calculations with the results of first process variable calculations that run in parallel and identifies errors in the second control variables if the deviations in two calculated control variables calculated in parallel exceed a predetermined differential, for instance. In the simplest case, the proper functioning of the second data link is monitored by simply detecting a mismatch in what should be parallel calculations of the process variables.

In the event of a fault, for instance a failure of the external computer unit or a failure of the second data link between it and the automation unit, the results of the first process variable calculations replace the second process variable calculations. Thus, for example, should the connection to the external computing unit be disconnected, the local controller again takes control and uses its own calculation algorithms to produce the process variables. This runs the plant less efficiently but prevents damage to the plant. Once the external computing unit is connected to the automation unit and again correctly providing process variables, the system switches back to using the process variables calculated by the external computing unit.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 1 is a schematic diagram of a system providing distributed process control of a technical plant;

DETAILED DESCRIPTION OF A PREFERRED EMBODIMENT

Throughout all the FIGURES, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

FIG. 1 shows a system 100 for controlling the industrial process 1, for instance a process for water treatment in a sewage treatment plant, or a process for transporting a liquid or a gas through a pipeline. The process 1 is controlled and regulated by way of decentralized, plant-side automation units 2. The decentralized, plant-side automation units 2 have respective functional connections 3 to sensors and actuators of the process (not shown). Although two automation units 2 are shown; in practice a plurality of automation units will control, regulate and monitor the process. The automation units 2 are connected by way of a first data link 4 to the monitoring system 5, which provides overall control and monitoring of the process 1.

The automation units 2 execute the monitoring and regulation functions 8 that influence the process, enabling the system 100 to carry out its control, regulation and monitoring tasks. The system 100 is functionally extended by an external computing unit 6 that is connected to one or more automation units 2 by a second data link 14. In FIG. 1, both automation units 2 are connected to the external computing unit 6 by way of the second data link 14. In other embodiments, any number of automation units can also be connected to the external computing unit, or just one. The second data link 14 may be either a wired or wireless connection, preferably an Internet connection.

The external computing unit 6 performs process variable calculations 11, for instance computationally highly-intensive regulation structures 7 or parallel simulations. Whether the process variables output by the calculations performed in the external computing unit 6 influence the process controlled by the automation component 2 is controlled by a switchover unit 9. The switchover unit 9 switches between the first process variable calculations 10 of the particular monitoring and regulation functions 8 of a particular automation unit 2 and the external second process variable calculations 11.

Input variables 12 used for performing second process variable calculations 11 are transferred from a program that executes the monitoring and regulation functions 8 within the automation unit 2, to a data transmission module 13, which sends the data to the external computing unit 6. Preferably the data transmission module 13 is a service agent that acquires data from the program or memory areas of the automation unit 2 largely independently.

What is claimed as new and desired to be protected by Letters Patent is set forth in the appended claims and includes equivalents of the elements recited therein:

What is claimed is:

1. Apparatus for controlling a process in a plant, the process having at least one plant-side automation unit that calculates first process variables using data provided by a monitoring system connected to the automation unit by a first data link, and uses calculated process variables to control the process, said apparatus further comprising:

at least one external computing unit that is external to the automation unit, said external computing unit being adapted to perform process variable calculations using data provided by the monitoring system that produce second process variables, said external computing unit performing more computation-intensive calculations than the automation unit and calculating the second process variables in parallel with the first process variable calculations performed by the automation unit; and a distributed communication mechanism connecting said external computing unit to the automation unit, said external computing unit being operatively connected by a second data link to exchange data with the automation unit, said second process variables being executed by the automation unit instead of the first process variables to control the process.

2. The apparatus of claim 1 further comprising at least one other external computing unit that is connected to the external computing unit, said other external computing unit being configured to perform process simulation tasks.

3. The apparatus of claim 2 wherein process simulation tasks performed by the other external computing unit are configured to selectably support one of a plurality of different optimization strategies for producing second process variables.

4. The apparatus of claim 3 further comprising an interface providing at least one external influencing factor to the other external computing unit, at least one of the simulation strategies being configured to react to the external influencing factor.

5. The apparatus of claim 1 further comprising a switchover unit, wherein second process variable calculations of the external computing unit are overlaid onto the first process variable calculations of the automation unit so that when a fault is detected in the second process variables, the switchover unit causes the first process variables calculated by the automation unit to be executed by the automation unit.

6. The apparatus of claim 1 further comprising a service agent configured to supply at least one external computing unit with process data from the automation unit by way of the corresponding second data link, and to supply the automation unit with second process variables calculated by the external computing unit.

7. A method for controlling a process in a plant, the process having at least one plant-side automation unit that uses calculated process variables to control the process, said automation unit being configured to calculate first process variables using data provided by a monitoring system connected by a first data link to the automation unit that monitors data produced by the process, said automation unit being connected by a second data link to at least one external computing unit that is external to the process automation unit, said method comprising the steps of:

performing more computation-intensive calculations using data provided to at least one external computing unit by the monitoring system that produce second process variables in parallel with the first process variable calculations performed by the automation unit;

supplying said second process variables to the automation unit using the a second data link;

controlling the process by executing the second process variables in the automation unit instead of the first process variables.

8. The method of claim 7, wherein a further automation function implemented is a process simulation task.

9. The method of claim 8, wherein second process variables of the process simulation task are calculated using different optimization strategies in the process simulation task.

10. The method of claim 7 wherein second process variables calculated by the external computing unit are overlaid onto the first process variables so that the first process variables are executed by the automation unit when a fault is detected in second process variables.

11. The method of claim 7 further comprising the step of monitoring the second process variables using the first data link that connects the automation unit to a monitoring system.

12. The method of claim 11 further comprising the step of executing first process variables instead of second process variables if there is a fault in the second data link or second process variables.

\* \* \* \* \*